United States Patent
Fukita

(10) Patent No.: US 8,239,717 B2
(45) Date of Patent: Aug. 7, 2012

(54) LOGIC VERIFICATION APPARATUS

(75) Inventor: Eiichi Fukita, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 498 days.

(21) Appl. No.: 12/603,972

(22) Filed: Oct. 22, 2009

(65) Prior Publication Data

US 2010/0138710 A1    Jun. 3, 2010

(30) Foreign Application Priority Data

Dec. 3, 2008    (JP) ................. 2008-308454

(51) Int. Cl.
    *G01R 31/28*    (2006.01)
    *G06F 11/00*    (2006.01)

(52) U.S. Cl. ...................................................... 714/741
(58) Field of Classification Search .................. 714/741, 714/724, 3, 32, 33; 703/13, 14, 15; 716/51, 716/106, 111, 112, 116, 136
See application file for complete search history.

(56) References Cited

U.S. PATENT DOCUMENTS

| | | | | |
|---|---|---|---|---|
| 6,018,807 A * | 1/2000 | Larson | ........................... | 714/33 |
| 6,237,117 B1 * | 5/2001 | Krishnamoorthy | ........... | 714/724 |
| 7,137,078 B2 * | 11/2006 | Singhal et al. | ................ | 716/102 |
| 7,734,973 B2 * | 6/2010 | Hiraide et al. | ................ | 714/729 |
| 7,757,191 B2 * | 7/2010 | Chan | ........................... | 716/108 |
| 7,895,492 B2 * | 2/2011 | Hiraide et al. | ................ | 714/739 |
| 7,934,183 B2 * | 4/2011 | Maturana et al. | ............ | 716/103 |
| 2011/0161897 A1 * | 6/2011 | Maturana et al. | ............ | 716/102 |

FOREIGN PATENT DOCUMENTS

JP    2003-316840    11/2003

* cited by examiner

*Primary Examiner* — Phung M Chung
(74) *Attorney, Agent, or Firm* — McDermott Will & Emery LLP

(57) ABSTRACT

To provide a logic verification apparatus capable of preventing, when an indeterminate value is generated in logic verification, the indeterminate value from being unintentionally erased. A simulation part performs a simulation based on a description of the logic function described in a hardware description language. A second symbol replacing part replaces an indeterminate value generated in the simulation by the simulation part with a symbol. The simulation part generates a symbol expression and propagates it to an element at a later stage when the symbol replaced by the second symbol replacing part reaches an element being processed. Therefore, unintentional erasing of the indeterminate value generated during the simulation can be prevented.

8 Claims, 11 Drawing Sheets

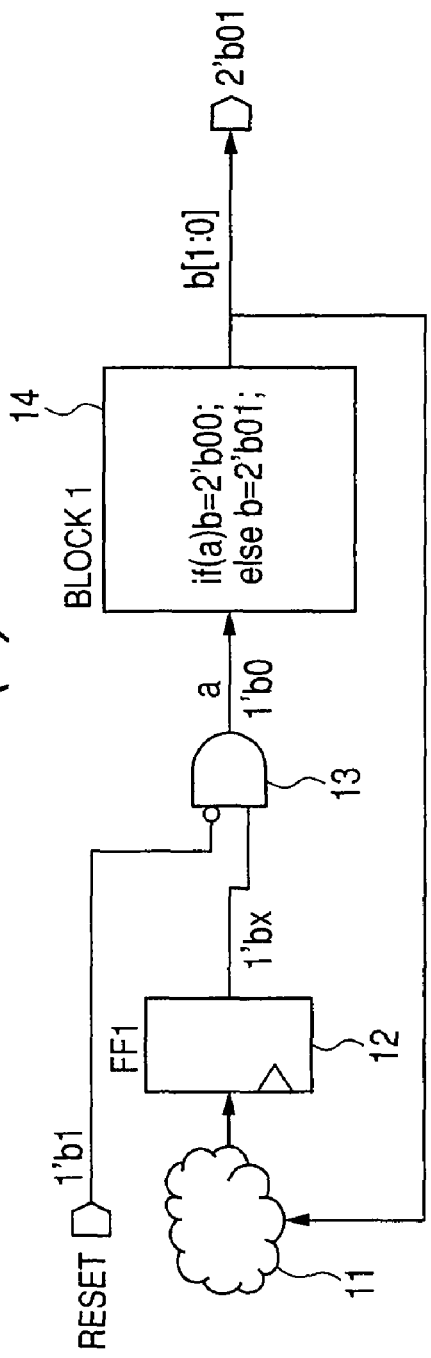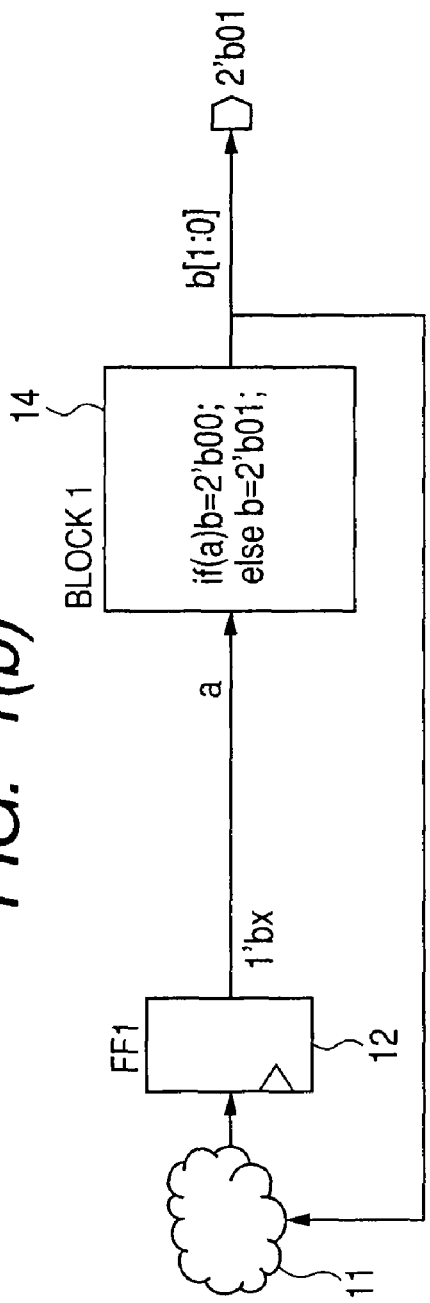

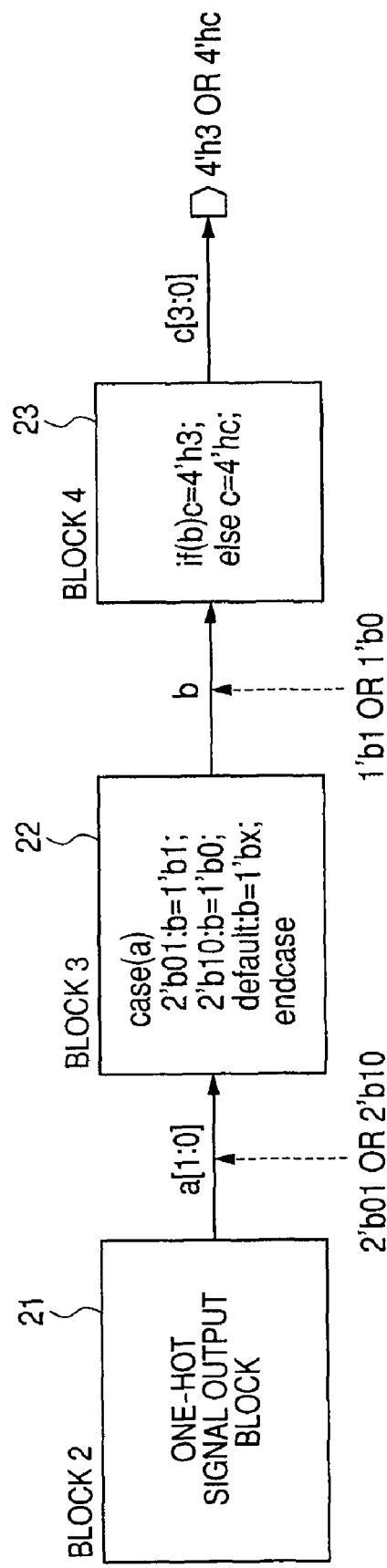
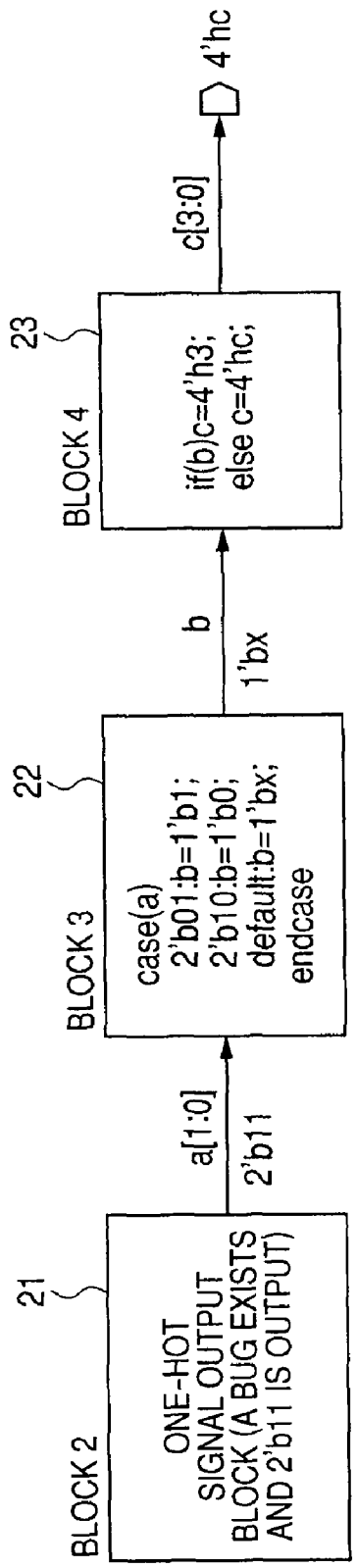

LOGIC VERIFICATION APPARATUS

CROSS-REFERENCE TO RELATED APPLICATION

The disclosure of Japanese Patent Application No. 2008-308454 filed on Dec. 3, 2008 including the specification, drawings and abstract is incorporated herein by reference in its entirety.

BACKGROUND OF THE INVENTION

The present invention relates to a technology of verifying logic functions created by a hardware description language such as Verilog HDL (Hardware Description Language), and particularly to a logic verification apparatus capable of preventing, when an indeterminate value is generated, the indeterminate value from being unintentionally erased, and identifying the source thereof.

In recent years, with semiconductor integrated circuits being equipped with many, high-performance functions, there arise needs for designing large-scale logic circuits in a short period. Additionally, HDL is receiving attention for reasons such that logic synthesis tools have reached a level for practical use, or prices of work stations and personal computers are decreasing while functions thereof are being enhanced.

Specifically, Verilog HDL, a grammar system based on C language, is being actively used among HDLs for reasons such as simplified description or abundant ability of describing a simulation. As a technology relating to Verilog HDL, there is an invention disclosed in Japanese Patent Laid-Open No. 2003-316840.

The invention disclosed in Japanese Patent Laid-Open No. 2003-316840 aims to perform only logic verification of design data described in the logic description language and eliminate the necessity of verifying the design data described in the net list by treating similarly the indeterminate value for the design data described in the logic description language and the design data described in the net list. The program causes a computer to execute an input procedure of inputting logic circuit design data described in the logic description language and a modification procedure of checking whether or not the signal in the logic circuit design data is an indeterminate value and, if it is an indeterminate value, changing the logic circuit design data so that the signal is propagated as an indeterminate value to a later stage of the logic circuit.

When branching of the signal is described in Verilog HDL, for example, the output value after the branching may be a determinate value even if the input value to the branching point is an indeterminate value (also denoted as X, hereinafter). In other words, it happens that X is erased for some cause. Accordingly, there may be a case that the user overlooks an "unintentional indeterminate value" generated in the circuit even if logic verification has been performed.

Particularly, it often happens that indeterminate values are not considered in logic synthesis performed after logic verification. That is, indeterminate values are treated as "Don't Care", and determined to be either "0" or "1" as the result of synthesis. Therefore, it is necessary to sufficiently confirm that an indeterminate value does not affect the specification of the circuit when performing an RTL (Register Transfer Level) simulation.

However, there has been a problem that, because X happens to be erased in the circuit as described above, the user overlooks generation of an "abnormal indeterminate value not treated as Don't Care" and failure is detected in or after the net list generated by logic synthesis, and thereby the logic verification must be executed again.

Additionally with the RTL design, an indeterminate value is often assigned to a branching that does not affect the circuit specification such as a branching that will not be selected, for example. In logic synthesis, it often happens that an indeterminate value is treated as "Don't Care" and assigned to one of the circuits outputting "0" or "1" that is more advantageous in terms of area.

Although "Don't Care" branching must not be essentially selected in an RTL simulation, it happens to be selected for some cause. It is not rare that X is erased in a branching statement of Verilog HDL and the user overlooks generation of an indeterminate value as described above. It also happens that an indeterminate value is generated not only in the X created by an RTL code but also in a register that has not been initialized, and therefore the user has to confirm that the indeterminate value has been properly processed and erased.

Such problems cannot be solved by using the invention disclosed in Japanese Patent Laid-Open No. 2003-316840.

The present invention has been made to solve the above problems and aims to provide a logic verification apparatus capable of preventing, when an indeterminate value generated in logic verification, the indeterminate value from being unintentionally erased.

SUMMARY OF THE INVENTION

According to an embodiment of the invention, a logic verification apparatus is provided which performs verification of logic functions described in a hardware description language. A simulation part performs a simulation based on a description of logic functions. A second symbol replacing part replaces an indeterminate value generated in the simulation performed by the simulation part by a symbol. When the symbol replaced by the second symbol replacing part reaches an element being processed, the simulation part generates a symbol expression and propagates it to an element at a later stage.

Since the simulation part generates a symbol expression and propagates it to an element at a later stage when the symbol replaced by the second symbol replacing part reaches an element being processed, unintentional erasing of the indeterminate value generated during the simulation can be prevented.

BRIEF DESCRIPTION OF THE DRAWINGS

FIGS. 1(a) and 1(b) show an exemplary case where an indeterminate value is unintentionally erased in logic verification.

FIGS. 2(a) and 2(b) show another exemplary case where an indeterminate value is unintentionally erased in logic verification.

DETAILED DESCRIPTION OF THE PREFERRED EMBODIMENTS

Figure 3A:
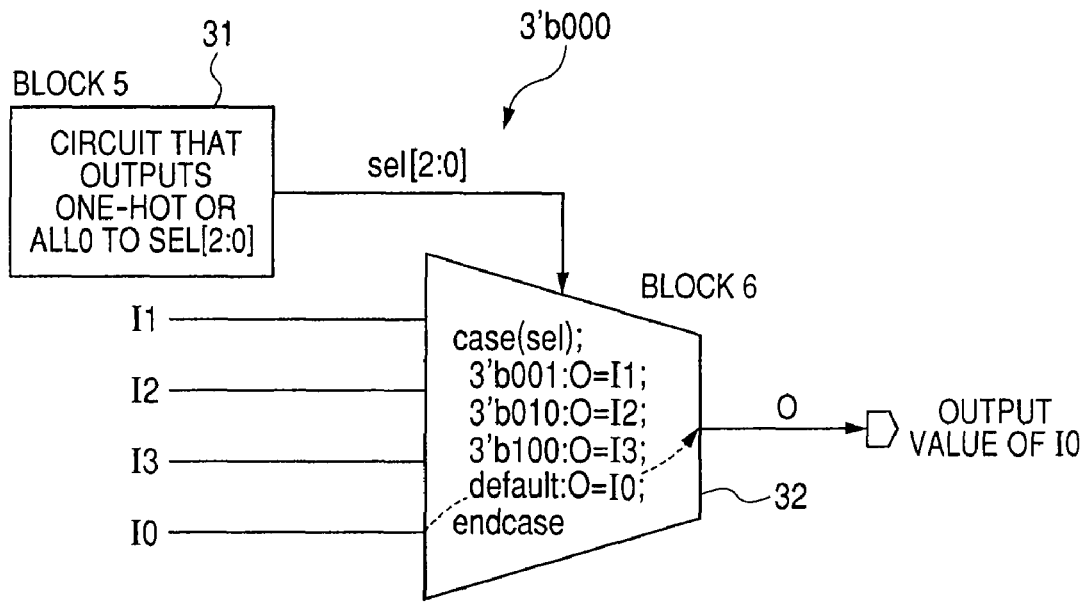
FIGS. 3(a) and 3(b) show still another exemplary case where an indeterminate value is unintentionally erased in logic verification.

Before describing a logic verification apparatus according to an embodiment of the invention, an exemplary case where an indeterminate value is unintentionally erased in logic verification will be described.

(Unintentionally erasing an indeterminate value in an "if" statement) For example, let us consider a case where a logic function is defined by the following description.

A description "if (b) c=4'h3; else c=4'hc;" outputs c=4'h3 when b=1'b1 and c=4'hc otherwise. For example, if b is an indeterminate value (b=1'bx), the output c takes a value of either 4'h3 or 4'hc because b can be either b=1'b0 or b=1'b1. However, a determinate value c=4'hc is propagated to later stages because an "else" clause is selected if b=1'bx in the simulation result. In this case, it suggests that the indeterminate value has been erased.

(Unintentionally erasing an indeterminate value in a "case" statement) A description "casez(d) 3'b000:e=2'b00; 3'b001: e=2'b01; 3'b01?:e=2'b10; 3'b1??:e=2'b11; endcase" outputs e=2'b00 when d=3'b000, e=2'b01 when d=3'b001, e=2'b10 when d=3b01?, and e=2'b11 when d=3'b1??. For example, when the least significant bit of d is an indeterminate value (d=3'b00x), the output e takes a value of either 2'b00 or 2'b01 because either d=3'b000 or d=3'001 is possible. However, substitution into e is not performed because there is no corresponding branching in the simulation result. It suggests that the indeterminate value has been erased when the preceding value is a determinate value because a value preceding e is preserved.

FIGS. 1(a) and 1(b) show an exemplary case where an indeterminate value is unintentionally erased in logic verification. FIG. 1(a), which is an exemplary logic circuit including a description of an "if" statement, shows the original, appropriate circuit. Although the logic circuit shown is that before logic synthesis, it is illustrated as including a description of a gate circuit or a flip-flop (FF) for ease of understanding.

The logic circuit includes a combinatorial circuit 11, a FF1 (12), an AND gate 13, and a block 1 (14). The AND gate 13 masks, by a reset signal (1'b1), an indeterminate value (1'bx) output from the FF1 (12) immediately after power-on. In this occasion, a=1'b0 is output from the AND gate 13.

The block 1 (14) outputs b=2'b00 when a=1'b1 and b=2'b01 when a=1'b0. Thus, b=2'b01 is output from the block 1 (14), and whereby the indeterminate value output from the FF1 (12) is properly masked.

FIG. 1(b), which is an exemplary logic circuit including a description of an "if" statement, shows a circuit including a bug. Compared with the logic circuit shown in FIG. 1(a), the logic circuit shown in FIG. 1(b) excludes the AND gate 13 for masking an indeterminate value from the FF1 (12). Therefore, an indeterminate value (1'bx) output from the FF1 (12) is input to the block 1 (14) as it is.

The block 1 (14) selects the "else" clause by the indeterminate value (1'bx) from the FF1 (12) and outputs b=2'b01. Therefore, the same value is output as when the indeterminate value from the FF1 (12) is properly masked. This may cause the user to overlook that x has been erased at the "if" branching.

FIGS. 2(a) and 2(b) show another exemplary case where the indeterminate value is unintentionally erased in logic verification. FIG. 2(a), which is an exemplary logic circuit including a description of an "if" statement and a "case" statement, shows the original, appropriate circuit. A block 2 (21), which is a one-hot signal output block, outputs a=2'b01 or a=2'b10.

A block 3 (22) outputs b=1'b1 when a=2'b01, outputs b=1'b0 when a=2'b10, and b=1'bx as a default value. In addition, a block 4 (23) outputs c=4'h3 when b=1'b1, and outputs c=4'hc when b=1'b0.

Therefore, it is suggested that c=4'h3 or c=4'hc is output from the block 4 (23) when a=2'b01 or a=2'b10 is properly output from the block 2 (21).

FIG. 2(b), which is an exemplary logic circuit including a description of an "if" statement and a "case" statement, shows a circuit including a bug. The block 2 (21) shown in FIG. 2(b) outputs, because of the bug, a=2'b11 which is not one-hot. In this occasion, an indeterminate value (b=1'bx) is output from the block 3 (22). However, the same result is obtained as when a one-hot signal 2'b10 is output from the block 2 (21) because the block 4 (23) outputs c=4'hc. This may cause the user to overlook that x has been erased at the "if" branching.

Figure 3B:
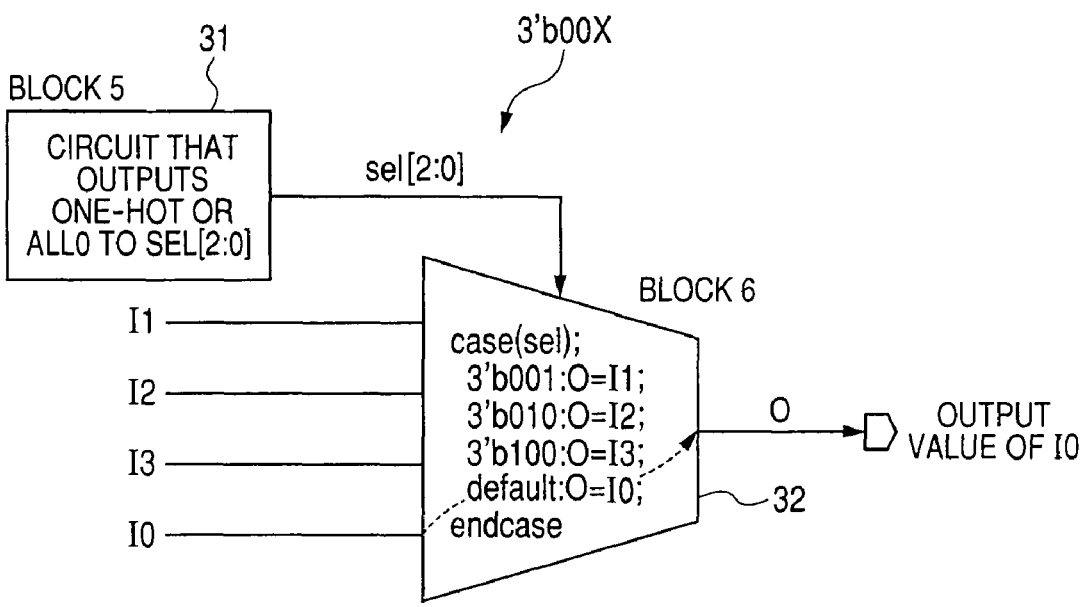

FIGS. 3(a) and 3(b) show still another exemplary case where an indeterminate value is unintentionally erased in logic verification. FIG. 3(a), which is an exemplary logic circuit including a description of a "case" statement, shows the original, appropriate circuit. A block 5 (31) is a logic function that outputs, to sel[2:0], one-hots (3'b001, 3'b010, 3'b100) or "all-bits 0" (3'b000).

A block 6 (32), which is a logic function described in a "case" statement, outputs O=I1 when sel=3'b001, O=I2 when sel=3'010, and O=I3 when sel=3'b100. In addition, the block 6 (32) outputs O=I0 as a default value.

When sel=3'b000 is output from the block 5 (31), for example, the default value O=I0 is output from the block 6 (32).

FIG. 3(b), which is an exemplary logic circuit including a description of a "case" statement, shows a circuit including a bug. The block 5 (31) shown in FIG. 3(b) outputs sel=3'b00x because of the bug. In this occasion, the same result as with sel=3'b000 is output because the block 6 (32) outputs the default O=I0. This may cause the user to overlook that x has been erased at the case branching.

However, when the logic function shown in FIG. 3(b) is logic synthesized and mapped onto a circuit, it can be synthesized into a circuit where the block 5 (31) outputs sel=3'b001. In this case, the block 6 (32) outputs O=I1, which can cause malfunction (an operation different from what is expected).

First Embodiment

Figure 4:
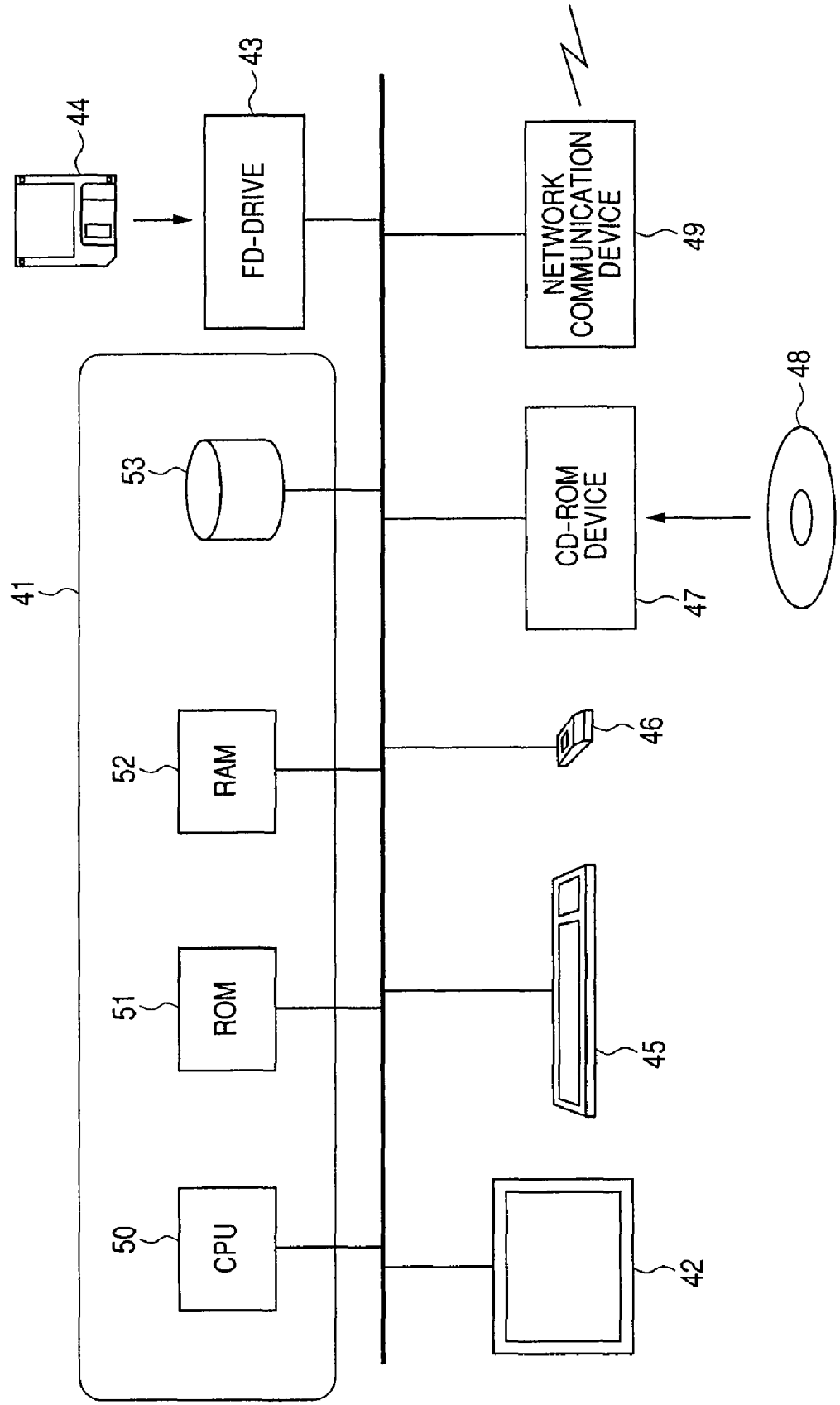
FIG. 4 is a block diagram showing an exemplary hardware configuration of a logic verification apparatus according to a first embodiment of the present invention.

FIG. 4 is a block diagram showing an exemplary hardware configuration of a logic verification apparatus according to a first embodiment of the present invention. The logic verification apparatus includes a computer 41, a display unit 42, an FD drive 43 on which a FD (Flexible Disk) 44 is loaded, a keyboard 45, a mouse 46, a CD-ROM device 47 on which a CD-ROM (Compact Disc-Read Only Memory) 48 is loaded, and a network communication device 49. A logic verification program is provided by a recording medium such as the FD44 or the CD-ROM 48.

Logic verification is performed by executing a logic verification program by the computer 41. In addition, the logic verification program may be provided to the computer 41 from another computer via a communication network.

The computer 41 shown in FIG. 4 includes a CPU (Central Processing Unit) 50, a ROM (Read Only Memory) 51, a RAM (Random Access Memory) 52, and a hard disk 53. The CPU 50 performs a processing while inputting and outputting data to and from the display unit 42, the FD drive 43, the keyboard 45, the mouse 46, the CD-ROM device 47, the network communication device 49, the ROM 51, the RAM 52, or the hard disk 53. The logic verification program recorded on the FD44 or the CD-ROM 48 is stored on the hard disk 53 by the CPU 50 via the FD drive 43 or the CD-ROM device 47. The CPU 50 performs logic verification by loading the logic verification program on the RAM 52 from the hard disk 53 and executing it as appropriate.

Figure 5:
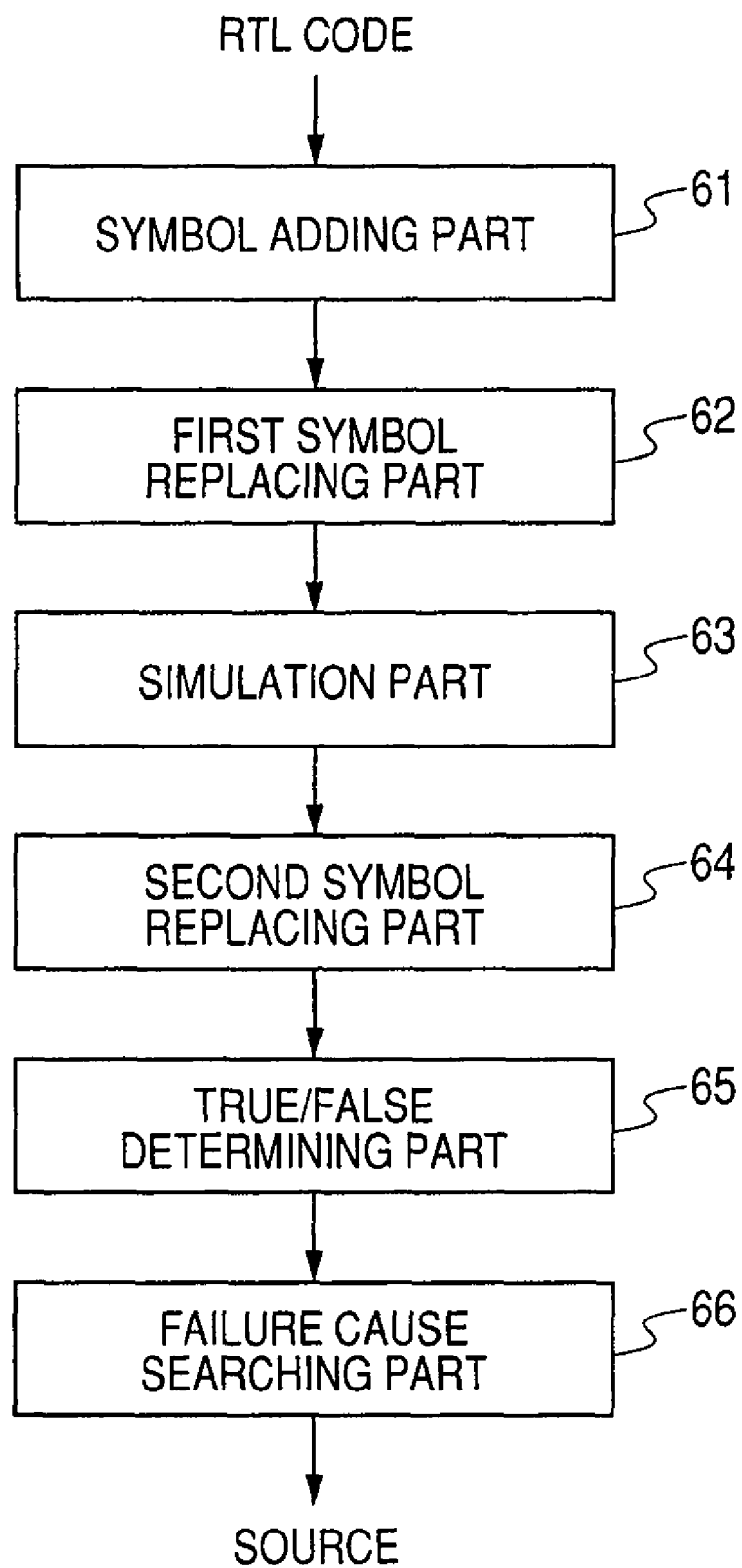
FIG. 5 is a block diagram showing a functional configuration of the logic verification apparatus according to the first embodiment of the present invention.

FIG. 5 is a block diagram showing the functional configuration of the logic verification apparatus according to the first embodiment of the present invention. The logic verification apparatus includes a symbol adding part 61, a first symbol replacing part 62, a simulation part 63, a second symbol replacing part 64, a truth/false determining part 65, and a failure cause searching part 66.

Upon input of the RTL code, the symbol adding part 61 extracts registers from the RTL code and assigns a symbol as an initial value. The first symbol replacing part 62 also extracts an X substitution part from the RTL code and replaces it with substitution of the symbol. These symbols are replaced by a symbol that evaluates both "0" and "1" and the source of failure can be identified by assigning unique symbols, for example, symbol1, symbol2 . . . or the like, as will be described below.

The simulation part 63 performs a similar process as with conventional logic simulation when the logic values 0, 1, x, or z (high impedance) have reached an element being processed. The simulation part 63 also performs the logic operation and propagates it to an element at a later stage as a symbol expression if a symbol or a symbol expression has reached an element being processed.

The second symbol replacing part 64 replaces the indeterminate value generated as a simulation result by the simulation part 63 with a symbol. The indeterminate state occurs, for example, when outputs of a driver conflict with each other, or a bus is not driven in a wired-OR. Similarly with the symbol adding part 61 or the first symbol replacing part 62, the second symbol replacing part 64 assigns a unique symbol when replacing the indeterminate value with a symbol.

The truth/false determining part 65 determines whether or not the symbol expression that reached an observation point coincides with the expected expression. The observation point and the expected expression are specified by the user.

The failure cause searching part 66 extracts symbols composing the symbol expression that has been determined not to coincide with the expected expression by the truth/false determining part 65 and identifies the source. Since a unique symbol is added as the symbol as described above, the source can be easily identified.

Figure 6:
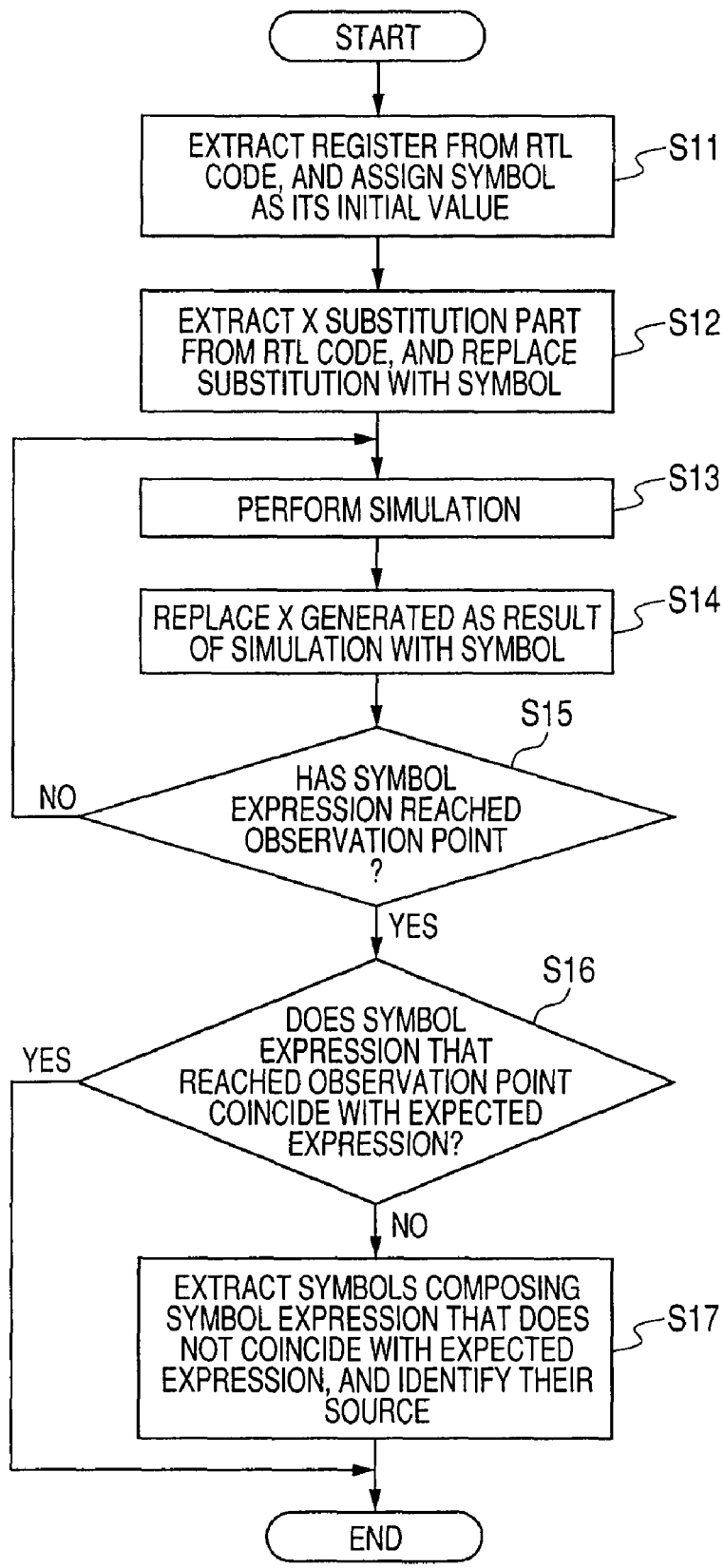
FIG. 6 is a flow chart illustrating a processing procedure of the logic verification apparatus according to the first embodiment of the present invention.
Figure 7:
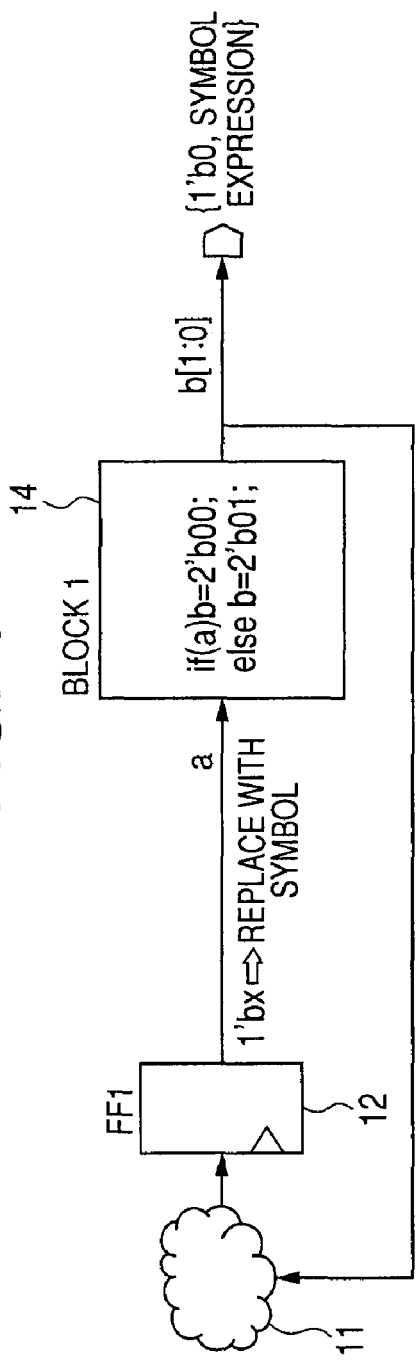
FIG. 7 is an explanatory diagram illustrating how a failure is detected in a circuit including a bug shown in FIG. 1(b).

FIG. 6 is a flow chart illustrating a processing procedure of the logic verification apparatus according to the first embodiment of the present invention. FIG. 7 is an explanatory diagram illustrating how a failure is detected in the circuit including a bug shown in FIG. 1(*b*). The processing procedure of the logic verification apparatus in the present embodiment will be described, referring to FIG. 7 as appropriate.

The symbol adding part 61 first extracts registers from the RTL code and assigns a symbol as its initial value (S11). In the circuit shown in FIG. 7, the FF1 (12) is extracted and 1'bx is replaced with a symbol as the initial value of the FF1 (12).

Next, the first symbol replacing part 62 extracts the X substitution part from the RTL code and replaces it with substitution of the symbol (S12). The processing will be described below referring to FIG. 9.

When a logical value, a symbol, or a symbol expression reaches an element being processed, the simulation part 63 performs the logic operation thereof (S13). In the circuit shown in FIG. 7, for example, when a symbol output from the FF1 (12) reaches the block 1 (14), the simulation part 63 evaluates both cases of "0" and "1" and assigns a symbol expression that can take either 2'b00 or 2'b01 to the output b. Because all the higher bits are "0", only the lower bits are treated as the symbol expression. For example, a value such as a concatenated expression according to Verilog {1'b0, symbol expression} is assigned.

Next, the second symbol replacing part 64 replaces X generated as a result of simulation with a symbol (S14). The processing will be described below referring to FIG. 8.

Next, the truth/false determining part 65 determines whether or not the symbol expression has reached an observation point specified by the user (S15). If the symbol expression has not reached the observation point (No in S15), the process flow returns to step S13 and repeats the processing thereafter.

If the symbol expression has reached the observation point (Yes in S15), the truth/false determining part 65 determines whether or not the symbol expression that reached the observation point coincides with the expected expression specified by the user (S16). If the symbol expression coincides with the expected expression (Yes in S16), the process is terminated.

If the symbol expression does not coincide with the expected expression (No in S16), the failure cause searching part 66 extracts symbols composing the symbol expression that does not coincide with the expected expression and identifies its source (S17). When the output of the block 1 (14) is selected as the observation point in the circuit shown in FIG. 7, it does not coincide with the expected expression specified by the user because the symbol expression is propagated from the block 1 (14). In this occasion, the failure cause searching part 66 identifies the source of the indeterminate value to be FF1 (14) by extracting symbols composing the symbol expression output from the block 1 (14).

When a symbol is input to an element and the output of the element becomes the symbol expression, in other words, when the expression is composed of more than one symbol and does not become a constant value even if it is optimized, the expression may be replaced again with a new symbol and propagated to later stages. Thereby complexity of the expression can be suppressed, and increase of memory amount to be used in performing a simulation.

Figure 8:
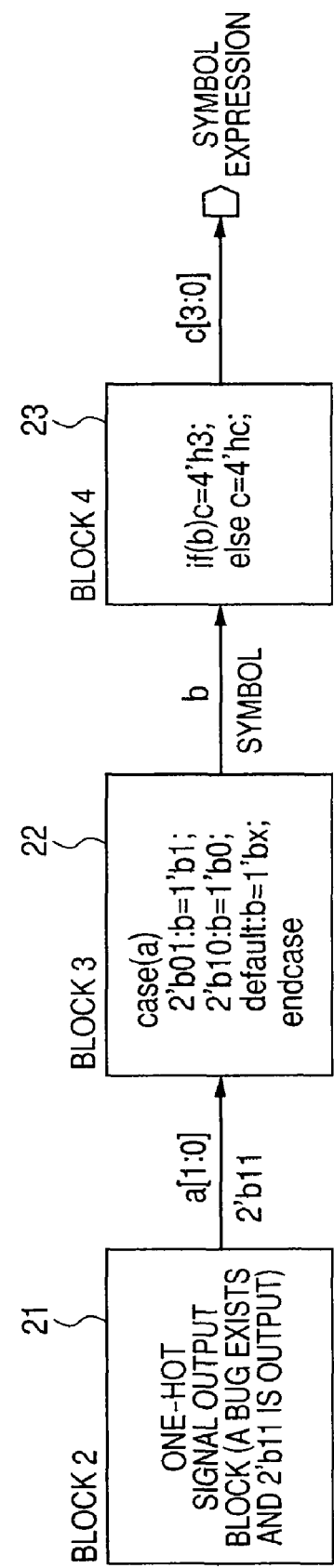
FIG. 8 is an explanatory diagram illustrating how a failure is detected in a circuit including a bug shown in FIG. 2(b).

FIG. 8 is an explanatory diagram illustrating how a failure is detected in the circuit including a bug shown in FIG. 2(*b*). By performing logic simulation of the block 3 (22) at step S13 of the flow chart shown in FIG. 6, the simulation part 63 outputs b=1'bx. At step S14, the second symbol replacing part 64 replaces the indeterminate value output from the block 3 (22) with a symbol.

When a symbol output from the block 3 (22) has reached the block 4 (23), the simulation part 63 evaluates both case of "0" and "1", and assigns a symbol expression that can take either 4'h3 or 4'hc to the output c.

If the output of the block 4 (23) has been selected as the observation point, it does not coincide with the expected expression specified by the user because the symbol expression is propagated from the block 4 (23). In this occasion, the failure cause searching part 66 identifies the source of the indeterminate value to be the block 3 (22) by extracting symbols composing the symbol expression output from the block 4 (23).

Figure 9:
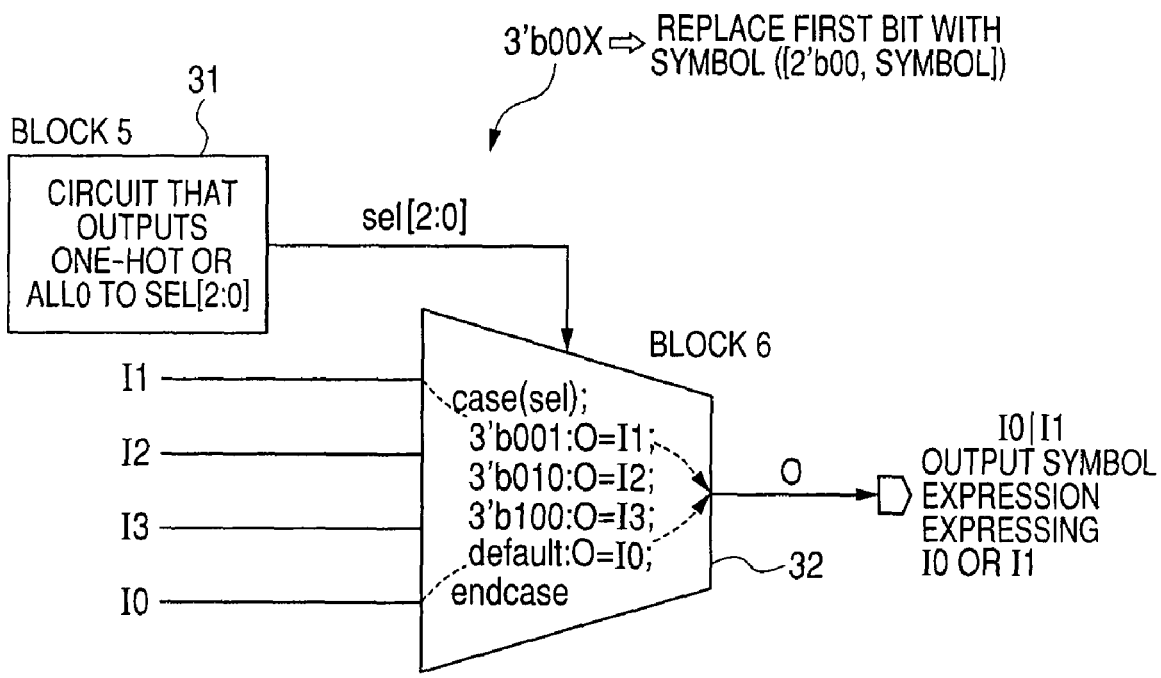
FIG. 9 is an explanatory diagram illustrating how a failure is detected in a circuit including a bug shown in FIG. 3(b).

FIG. 9 is an explanatory diagram illustrating how a failure is detected in the circuit including a bug shown in FIG. 3(b). By extracting the X substitution part at step S12 of the flow chart shown in FIG. 6, the first symbol replacing part 62 extracts an output sel[2:0]=3'b00x from the block 5 (31), replaces its first bit with a symbol, and outputs (2'b00, symbol).

Then, when a symbol output from the block 5 (31) has reached the block 6 (32), the simulation part 63 evaluates both cases that the first bit is "0" and "1", and assigns a symbol expression expressing OR of I0 and I1 to the output O.

If the output of the block 6 (32) has been selected as the observation point, it does not coincide with the expected expression specified by the user because the symbol expression is propagated from the block 6 (32). In this occasion, the failure cause searching part 66 identifies the source of the indeterminate value to be the block 5 (31) by extracting symbols composing the symbol expression output from the block 6 (32).

According to the logic verification apparatus in the present embodiment as described above, an indeterminate value can be prevented from being erased during a simulation and the user can easily grasp a problem because, when the indeterminate value is replaced with a symbol and the symbol or the symbol expression reached an element being processed, the simulation part 63 performs a logic operation so that they are propagated to later elements as the symbol expression.

Additionally, when the symbol expression that has reached the observation point does not coincide with the expected expression, the failure cause searching part 66 extracts symbols composing the symbol expression and identifies its source, whereby the user can easily identify where in the circuit a problem occurred.

Second Embodiment

The hardware configuration of the logic verification apparatus according to a second embodiment of the present invention is similar to that of the logic verification apparatus according to the first embodiment shown in FIG. 4. Therefore, detailed description of duplicate configurations and functions will not be repeated.

Figure 10:
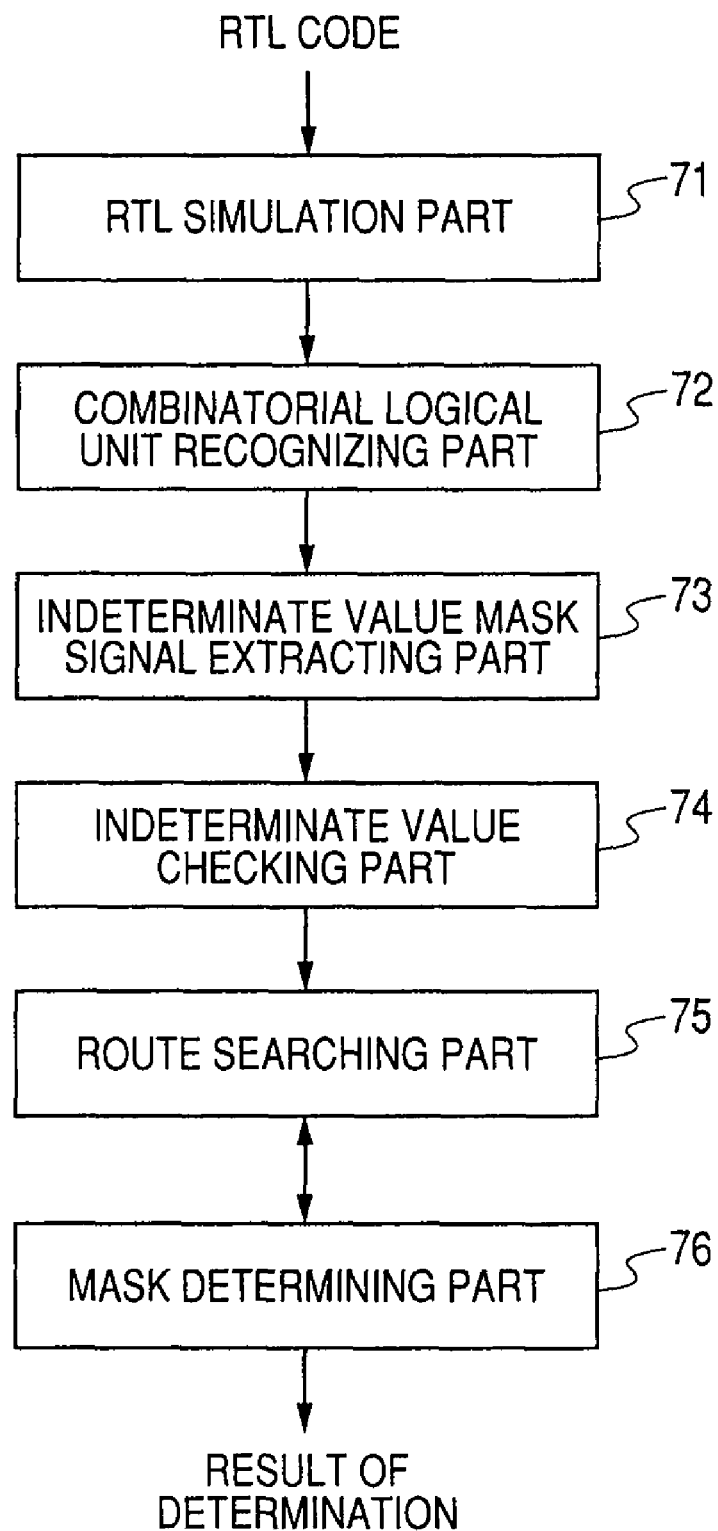
FIG. 10 is a block diagram showing a functional configuration of a logic verification apparatus in a second embodiment of the present invention.

FIG. 10 is a block diagram showing the functional configuration of the logic verification apparatus according to the second embodiment of the present invention. The logic verification apparatus includes an RTL simulation part 71, a combinatorial logical unit recognizing part 72, an indeterminate value mask signal extracting part 73, an indeterminate value checking part 74, a route searching part 75, and a mask determining part 76.

When the RTL code is input, the RTL simulation part 71 performs a simulation according to the description of the RTL code and creates a simulation result (waveform data). For this simulation, conventional function verification such as VCS (registered trademark), NC-Verilog (registered trademark), or the like are used.

The combinatorial logical unit recognizing part 72 reads the RTL code and separates the registers to recognize combinatorial logical units.

The indeterminate value mask signal extracting part 73 extracts a signal that masks the indeterminate value. The signal can be a user specified mask signal, a set/reset signal recognizable from the RTL code, or the like.

Referring to waveform data created by the RTL simulation part 71, the indeterminate value checking part 74 confirms generation of an indeterminate value. Upon confirming generation of an indeterminate value, the indeterminate value checking part 74 also confirms whether or not a signal value that masks the indeterminate value exists in the same cycle where the indeterminate value has been generated. In addition, the indeterminate value checking part 74 determines, referring to the combinatorial logical unit recognized by the combinatorial logical unit recognizing part 72, whether or not a signal that masks the indeterminate value exists in the combinatorial logical unit where the indeterminate value has been generated.

The route searching part 75 searches a route to the register from the node at which the indeterminate value has been generated and determines whether or not the route intersects the indeterminate value mask signal extracted by the indeterminate value mask signal extracting part 73. Although the determination may merely determine whether there is a route connecting the indeterminate value and the indeterminate value mask signal, precision can be improved by performing the search while replacing the indeterminate value (X) with a symbol and propagating the symbol, as described according to the first embodiment.

The mask determining part 76 determines whether or not the indeterminate value is properly masked in the combinatorial logical unit. For example, the determination is performed by setting an input terminal to which the indeterminate value has been propagated to "0" and "1" in a cell of a point at which the indeterminate value and the indeterminate value mask signal intersect, and determining whether output values of the cell exhibit the same value. This is similar to the confirmation using a symbol described in the first embodiment.

Figure 11:
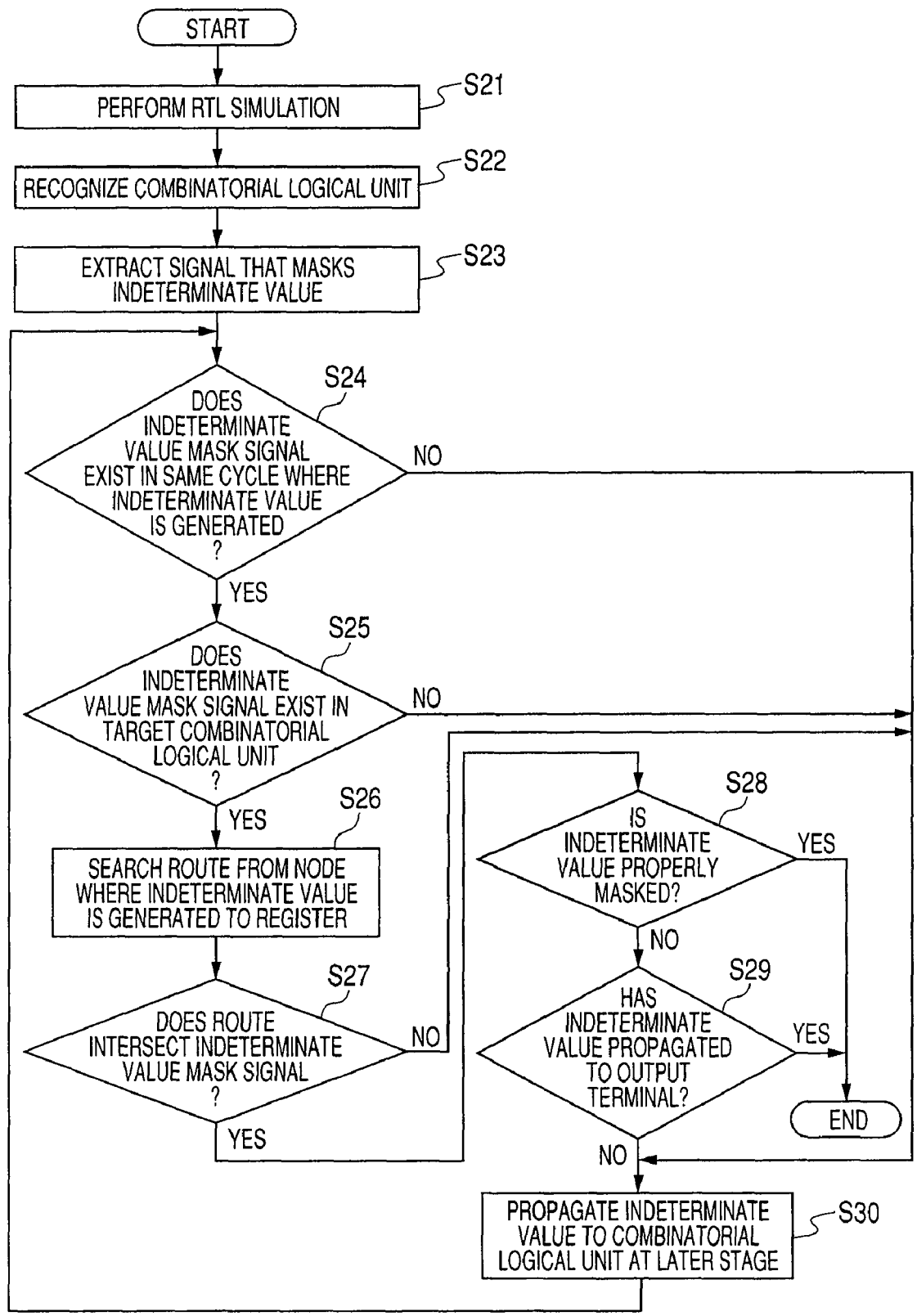
FIG. 11 is a flow chart illustrating a processing procedure of the logic verification apparatus according to the second embodiment of the present invention.
Figure 12:
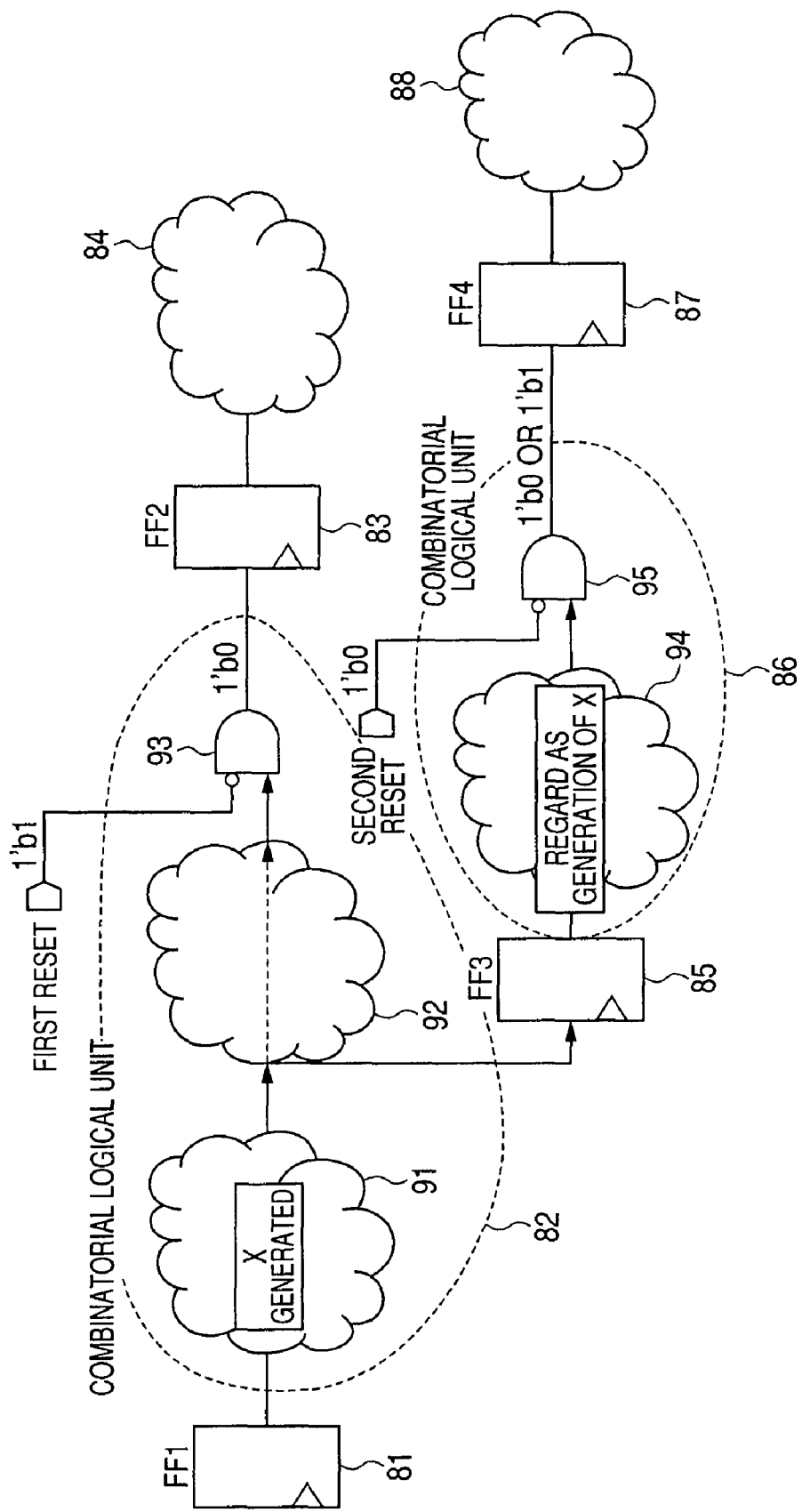
FIG. 12 shows an exemplary circuit where logic verification is performed by the logic verification apparatus according to the second embodiment of the present invention.

FIG. 11 is a flow chart illustrating a processing procedure of the logic verification apparatus according to the second embodiment of the present invention. FIG. 12 shows an exemplary circuit where the logic verification is performed by the logic verification apparatus according to the second embodiment of the present invention. Referring to FIG. 12 as appropriate, the processing procedure of the logic verification apparatus in the present embodiment will be described.

First, the RTL simulation part 71 performs a simulation to create waveform data (S21).

Next, the combinatorial logical unit recognizing part 72 recognizes the combinatorial logical unit by separating the registers (S22). In the circuit shown in FIG. 12, FF1 (81) and FF2 (83) are separated, and a circuit located therebetween is recognized as a combinatorial logical unit 82. In addition, FF3 (85) and FF4 (87) are separated, and a circuit located therebetween is recognized as a combinatorial logical unit 86. In FIG. 12, the combinatorial logical unit 82 includes combinatorial circuits 91 and 92, and an AND gate 93. Additionally, the combinatorial logical unit 86 includes a combinatorial circuit 94 and an AND gate 95.

The indeterminate value mask signal extracting part 73 then extracts a signal that masks the indeterminate value from the RTL code (S23). In FIG. 12, a first reset signal (1'b1) coupled to the AND gate 93 and a second reset signal (1'b0) coupled to the AND gate 95 are extracted.

Subsequently, referring to the waveform data created by the RTL simulation part 71, the indeterminate value checking part 74 confirms generation of an indeterminate value. Then, the indeterminate value checking part 74 determines whether or not the signal value that masks the indeterminate value exists in the same cycle where the indeterminate value has been generated (S24). If the signal value that masks the indeterminate value does not exist in the same cycle where the indeterminate value has been generated (No in S24), the process flow proceeds to step S30.

If the signal value that masks the indeterminate value exists in the same cycle where the indeterminate value has been generated (Yes in S24), the process flow proceeds to step S25. In FIG. 12, for example, the indeterminate value has been generated in the combinatorial circuit 91. It is determined whether or not the cycle where the indeterminate value has been generated exists in the cycle of the signal value of the first reset (1'b1) or the signal value of the second reset (1'b0).

At step S25, the indeterminate value checking part 74 determines, referring to the combinatorial logical unit recognized by the combinatorial logical unit recognizing part 72, whether or not a signal that masks the indeterminate value exists in the combinatorial logical unit where the indeterminate value has been generated (S25). If a signal that masks the indeterminate value does not exist in the combinatorial logical unit where the indeterminate value has been generated (No in S25), the process flow proceeds to step S30.

If the signal that masks the indeterminate value exists in the combinatorial logical unit where the indeterminate value has been generated (Yes in S25), the process flow proceeds to step S26. In FIG. 12, for example, it is determined that the first reset signal exists in the combinatorial logical unit 82 including the combinatorial circuit 91 where the indeterminate value has been generated.

At step S26, the route searching part 75 searches a route to the register from the node at which the indeterminate value has been generated (S26). The route searching part 75 then determines whether or not the route intersects the indeterminate value mask signal extracted by the indeterminate value mask signal extracting part 73 (S27). If the route does not intersect the indeterminate value mask signal (No in S27), the process flow proceeds to step S30.

If the route intersects the indeterminate value mask signal (Yes in S27), the process flow proceeds to step S28. In FIG. 12, for example, a route to the FF2 (83) from the node at which the indeterminate value in the combinatorial circuit 91 has been generated is searched, and it is determined that it intersects the first reset signal in the AND gate 93.

On the other hand, although a route to the FF3 (85) from the node at which the indeterminate value in combinatorial circuit 91 has been generated is also searched, the indeterminate value is propagated to the combinatorial logical unit 86 of a later stage because it does not intersect the indeterminate value mask signal.

At step S28, the mask determining part 76 determines whether the indeterminate value is properly masked by setting the input terminal to which the indeterminate value has been propagated to "0" and "1" in a cell of an intersecting point, and determining whether outputs of the cell exhibit the same value. If the indeterminate value is properly masked (Yes in S28), the process is terminated. In FIG. 12, for example, the input terminal to which the indeterminate value of the AND gate 93 is input is set to "0" and "1". If the outputs of the AND gate 93 is the same value (1'b0), it is determined that the indeterminate value is properly masked.

If the indeterminate value is not properly masked (No in S28), it is determined whether the indeterminate value has been propagated to the output terminal (S29). If the indeterminate value has been propagated to the output terminal (Yes in S29), the process is terminated. In this case, because there is failure in the RTL code, the user corrects the RTL code.

If the indeterminate value has not been propagated to the output terminal (No in S29), the indeterminate value is propagated to a combinatorial logical unit of a later stage (S30), and the process flow returns to step S24 to repeat the processing thereafter. In FIG. 12, for example, the indeterminate value generated in the combinatorial logical unit 82 is propagated to the FF3 (85) without being masked, and whereby the indeterminate value thereof is propagated to the combinatorial logical unit 86 of a later stage. Subsequently, processing after step S24 is performed assuming that the indeterminate value is generated in the combinatorial logical unit 86.

According to the logic verification apparatus of the present embodiment as thus described, when an indeterminate value is generated due to an RTL simulation, a cell of a point at which the indeterminate value intersects the indeterminate value mask signal is extracted and it is determined whether the indeterminate value is properly masked in the cell. Since the indeterminate value is propagated to a combinatorial logical unit of a later stage when it is not properly masked, the user can easily grasp a problem when the indeterminate value is propagated to the output terminal.

It should be noted that the embodiments disclosed herein are for illustrative purposes in all respects and not limiting the present invention. It is intended that the scope of the present invention is defined by the appended claims and not by the foregoing description, and that any modification within the scope of the claims, and meanings and range of equivalents are included therein.

What is claimed is:

1. A logic verification apparatus that verifies a logic function described in a hardware description language, the apparatus comprising:
   a simulation means that performs a simulation based on a description of the logic function; and
   a first replacing means that replaces an indeterminate value generated in the simulation by the simulation means with a symbol, wherein
   the simulation means generates a symbol expression and propagates it to an element at a later stage when the symbol replaced by the first replacing means reaches an element being processed.

2. The logic verification apparatus according to claim 1, further comprising a symbol adding means that extracts registers from the description of the logic function and adds a symbol as an initial value thereof, wherein the simulation means generates the symbol expression and propagates it to an element at a later stage when the symbol replaced by the first replacing means or the symbol added by the symbol adding means reaches an element being processed.

3. The logic verification apparatus according to claim 2, further comprising a second replacing means that extracts a substitution part of the indeterminate value from the description of the logic function and replaces the substitution part of the indeterminate value with the substitution part of the symbol, wherein the simulation means generates the symbol expression and propagates it to an element at a later stage when the symbol replaced by the first replacing means, the symbol added by the symbol adding means, or the symbol replaced by the second replacing means reaches an element being processed.

4. The logic verification apparatus according to claims 1, further comprising a determination means that, when the symbol expression reaches a specified observation point, determines whether or not the symbol expression coincides with an expected expression.

5. The logic verification apparatus according to claim 4, further comprising an identification means that identifies a source of the indeterminate value based on symbols composing the symbol expression determined by the determination means not to coincide with the expected expression.

6. A logic verification apparatus that verifies a logic function described in a hardware description language, the apparatus comprising:
   a simulation means that performs a simulation based on a description of the logic function;
   an extraction means that extracts a signal for masking an indeterminate value; and
   a determination means that, when the result of simulation by the simulation means includes an indeterminate value, determines whether or not the indeterminate value is properly masked by the signal for masking the indeterminate value extracted by the extraction means.

7. The logic verification apparatus according to claim 6, wherein the determination means determines whether or not the indeterminate value is properly masked by setting an input terminal to which the indeterminate value is input to 0 and 1, and determining whether or not outputs thereof exhibit a same value, in an element to which the indeterminate value and the signal for masking the indeterminate value are input.

8. The logic verification apparatus according to claims 6, further comprising a recognition means that recognizes a combinatorial logical unit by extracting registers from the description of the logic function and separating the registers, wherein the determination means determines whether or not the indeterminate value is properly masked in a second combinatorial logical unit of the later stage to which the indeterminate value propagates, when it is determined that the indeterminate value is not properly masked in a first combinatorial logical unit recognized by the recognition means.

* * * * *